(12) United States Patent
Gong

(10) Patent No.: US 11,940,852 B2
(45) Date of Patent: Mar. 26, 2024

(54) BIG DATA CLOUD COMPUTING ALL-IN-ONE MACHINE APPARATUS

(71) Applicant: Guangdong Peizheng College, Guangzhou (CN)

(72) Inventor: Jianhu Gong, Guangzhou (CN)

(73) Assignee: GUANGDONG BAIYUN UNIVERSITY, Guangzhou (CN)

( * ) Notice: Subject to any disclaimer, the term of this patent is extended or adjusted under 35 U.S.C. 154(b) by 270 days.

(21) Appl. No.: 17/570,083

(22) Filed: Jan. 6, 2022

(65) Prior Publication Data

US 2022/0229473 A1 Jul. 21, 2022

(51) Int. Cl.
*H05K 5/02* (2006.01)
*G06F 1/18* (2006.01)
*G06F 1/20* (2006.01)

(52) U.S. Cl.
CPC ............... *G06F 1/181* (2013.01); *G06F 1/20* (2013.01); *H05K 5/0213* (2013.01); *H05K 5/0234* (2013.01)

(58) Field of Classification Search
CPC .................................................... H05K 5/0234
See application file for complete search history.

(56) References Cited

U.S. PATENT DOCUMENTS

| 8,248,780 | B2* | 8/2012 | Zheng | G06F 1/16 361/679.48 |
| 10,108,221 | B1* | 10/2018 | Gu | G06F 1/181 |
| 2004/0150945 | A1* | 8/2004 | Mache | G06F 1/1601 361/679.21 |
| 2007/0088875 | A1* | 4/2007 | Martin | G06F 1/1632 710/62 |
| 2012/0305503 | A1* | 12/2012 | Smith | G06F 1/1667 211/26 |
| 2016/0037665 | A1* | 2/2016 | Zhang | F16M 11/105 248/371 |
| 2020/0133331 | A1* | 4/2020 | Ferris | H05K 5/0217 |

* cited by examiner

*Primary Examiner* — Sherman Ng
(74) *Attorney, Agent, or Firm* — Tutunjian & Bitetto, P.C.

(57) ABSTRACT

A big data cloud computing all-in-one machine apparatus, including an all-in-one machine main body, an integrated display screen and a back box support column is provided. A middle part of a top end of the all-in-one machine main body is fixedly connected with the integrated display screen, and a front surface of the integrated display screen is fixedly connected with the back box support column. Two sides of the top end of the all-in-one machine main body are fixedly connected with the top heat dissipation openings; the bottom end of the embedded support seat is fixedly connected with the base antiskid grounding mat; one end of the embedded support seat is fixedly connected with the embedded storage tab. The embedded support seat well improves the convenience of the device; the top heat dissipation openings well reflect the heat dissipation effectiveness of the device.

9 Claims, 6 Drawing Sheets

BIG DATA CLOUD COMPUTING ALL-IN-ONE MACHINE APPARATUS

CROSS REFERENCE TO RELATED APPLICATION

This patent application claims the benefit and priority of Chinese Patent Application No. 202110058925.1 filed on Jan. 17, 2021, the disclosure of which is incorporated by reference herein in its entirety as part of the present application.

TECHNICAL FIELD

The present disclosure belongs to the technical field of big data processing equipment, and specifically relates to structures for big data cloud computing.

BACKGROUND

With the development of science, technology and society, the data volume in various fields has increased rapidly. With the increase in the data volume, the type and structure of data have become more and more complex. For various fields such as government, finance, communications, Internet and other fields, their decisions made through mining, analysis and prediction of big data will be more accurate and bring greater benefits.

SUMMARY

As appreciated by the present inventors, many support columns of existing all-in-one machines are of a fixed design, cannot be folded, and do not have a good contracting and folding design, which causes great inconvenience during transporting and carrying the machines. The existing all-in-one machines are not provided with a good installation fixing design, and are supported by a support structure, so that the installation diversity is low. The existing all-in-one machines are fixedly connected to a back box, which is inconvenient to disassemble and assemble, and the assembly fixity is insufficient.

The present disclosure aims to provide a big data cloud computing all-in-one machine apparatus in order to solve the problems (poor shrinking and folding design, low installation diversity and insufficient assembly fixity mentioned in the background art).

The technical solution used in the present disclosure is as follows. A big data cloud computing all-in-one machine apparatus includes an all-in-one machine main body, an integrated display screen and a back box support column. A middle part of a top end of the all-in-one machine main body is fixedly connected with the integrated display screen, and a front surface of the integrated display screen is fixedly connected with the back box support column.

A bottom of the back box support column is embedded and connected with an embedded support seat; an inner middle part of the embedded support seat is connected with a support shaft bayonet pin in a penetrating manner; a bottom middle part of the back box support column is connected with a support column folding shaft in a penetrating manner; and one side of a top end of the embedded support seat is fixedly connected with a support seat weighting block.

Two sides of the front surface of the all-in-one machine main body are fixedly connected with fixed pressing suction cups. The middle part of the top end of the all-in-one machine main body is fixedly connected with hanging hollow guide rail, inner sides of the hanging hollow guide rail are movably connected with hanging belt movable pieces. An adjustable fixed hanging belt penetrates through and is connected with the hanging belt movable pieces, and hanging belt stoppers penetrate through and are connected with the adjustable fixed hanging belt.

One end of the all-in-one machine main body is fixedly connected with a back box connection snap-in slot, and one inner side of the back box connection snap-in slot is fixedly connected with connection jacks. Each connection jack has a connection insertion block inserted therein. One end of the connection insertion block is fixedly connected with an embedded back box, and ends of the embedded back box are movably connected with a back box snap-in spring. Each back box snap-in spring is sleeved on a spring pull grip; and one side of the back box connection snap-in slot is embedded and connected with an embedded limiting block.

In some embodiments, both sides of the top end of the all-in-one machine main body are fixedly provided with top heat dissipation openings.

In some embodiments, one end of the embedded support seat is fixedly connected with an embedded storage tab.

In some embodiments, a bottom end of the embedded support seat is fixedly connected with a base antiskid grounding mat.

In some embodiments, one side of a bottom of a rear surface of the all-in-one machine main body is fixedly connected with gathering winding columns.

In some embodiments, a middle part of one side of the all-in-one machine main body is connected with a side embedded storage box in an embedded manner.

In some embodiments, the embedded support seat at the bottom of the back box support column, the support shaft bayonet pin at the inner middle part of the embedded support seat, the support column folding shaft at the bottom middle part of the embedded support seat, and the support seat weighting block on one side of the top end of the embedded support seat jointly form a back box support and storage mechanism.

In some embodiments, the fixed pressing suction cups on both sides of the front surface of the all-in-one machine main body, the hanging hollow guide rail at the middle part of the top end of the all-in-one machine main body, the hanging belt movable piece between the inner sides of the hanging hollow guide rail, the adjustable fixed hanging belt penetrating through the hanging belt movable piece, and the hanging belt stoppers penetrating through the adjustable fixed hanging belt jointly form an integrated installation fixing mechanism.

In some embodiments, the back box connection snap-in slot at the one end of the all-in-one machine main body, the connection jack on the one inner side of the back box connection snap-in slot, the connection insertion block on the inner side of the connection jack, the embedded back box at the one end of the connection insertion block, the back box snap-in spring at the top end of the embedded back box, and the spring pull grip on the inner side of the back box snap-in spring jointly from an all-in-one machine back box assembling fixing mechanism.

In summary, the above-mentioned technical solution is used, so that the present disclosure has the beneficial effects as follows.

1. In the present disclosure, by providing a back box support and storage mechanism, the interior of the embedded support seat is desired as a hollow slot design, so that the back box support column can be folded towards the right side around the support column folding shaft of the embedded support seat penetrating through the back box support column. The back box support column is embedded into an embedding slot at one side of the embedded support seat when folded to a horizontal state, thus achieving a contracted storage effect. During use, the back box support column is unfolded around the support column folding shaft to a vertical state; the support shaft bayonet pin is inserted from one side to support a display screen to work; Moreover, the support seat weighting block arranged on the left side can well balance a relatively short force arm of the support seat located at the left side, which well reflects the storage flexibility of the all-in-one machine.

2. In the present disclosure, by providing an integrated installation fixing mechanism, the integrated installation fixing mechanism can be hung on a hook or a rod through the adjustable fixed hanging belt. During installation, the adjustable fixed hanging belt is hanged onto the hook, and is pulled to move the hanging belt movable pieces along the hanging hollow guide rail so that the adjustable fixed hanging belt tightly wrap the hook. After wrapping, the hanging belt stoppers are threaded into limiting holes of the hanging belt located at corresponding positions to complete installation. Further, the fixed pressing suction cups are tightly sucked on a wall face by using an air pressure difference, thus well reflecting the installation fixity of the all-in-one machine.

3. In the present disclosure, by providing an all-in-one machine back box assembling fixing mechanism, during assembling, the embedded back box is embedded into the back box connection snap-in slot. In the embedding process, the connection insertion block is snapped into the connection jack to complete connection. After the embedding, the embedded back box is snapped into place and fixed through the back box snap-in spring. Then, the spring is fixed through the spring pull grip, and finally, the embedded limiting block is threaded into the back box connection snap-in slot to limit the embedded back box, thus further improving the assembling fixity. During disassembling, only the spring is released according to the above steps, and the embedded back box is taken out, which well reflects the assembling convenience of the all-in-one machine.

4. In the present disclosure, both sides of the top end of the all-in-one machine main body are fixedly provided with top heat dissipation openings. Some existing all-in-one machines do not have an extremely good heat dissipation design. In most existing all-in-one machines, heat dissipation structures are arranged on a back surface or a side surface, so heat dissipation is easily blocked. By providing the top heat dissipation openings at the top end of the all-in-one machine, heat can be dissipated upwards to well prevent the influence on the heat dissipation due to blockage of the side surface or the back surface, which well reflects the heat dissipation effectiveness of the device. One end of the embedded support seat is fixedly connected with the embedded storage tab. Since the device has a good gathering portability design. The support base does not have a good force holding structure. By providing the embedded storage tab, work staff can hold the embedded storage tab to hold the support base under a force applied. The all-in-one machine is carried and transferred through the embedded storage tab, so that the convenience of the device is well improved.

5. In the present disclosure, the bottom end of the embedded support seat is fixedly connected with a base antiskid grounding mat. Since the integrated display screen is relatively large, the existing integrated display screen does not have a good stable design. By providing the base antiskid grounding mat which is an antiskid rubber mat arranged at the bottom end of the embedded support seat, the friction between the all-in-one machine and a lower mat surface can be well increased, to well prevents the all-in-one machine from sliding, which well reflects the reinforcement stability of the all-in-one machine. One side of the bottom of the rear surface of the all-in-one machine main body is fixedly connected with a gathering winding column. The all-in-one machine is connected with numerous wires, some existing all-in-one machines do not have a good wire gathering structure, and thus placement of the wires at random easily causes intertwining. By providing the gathering winding column which has a good winding column design, the work staff can orderly place the wires along the gathering winding column, thus well reflecting the gathering convenience of the all-in-one machine.

REFERENCE SIGNS IN DRAWINGS

Figure 1:
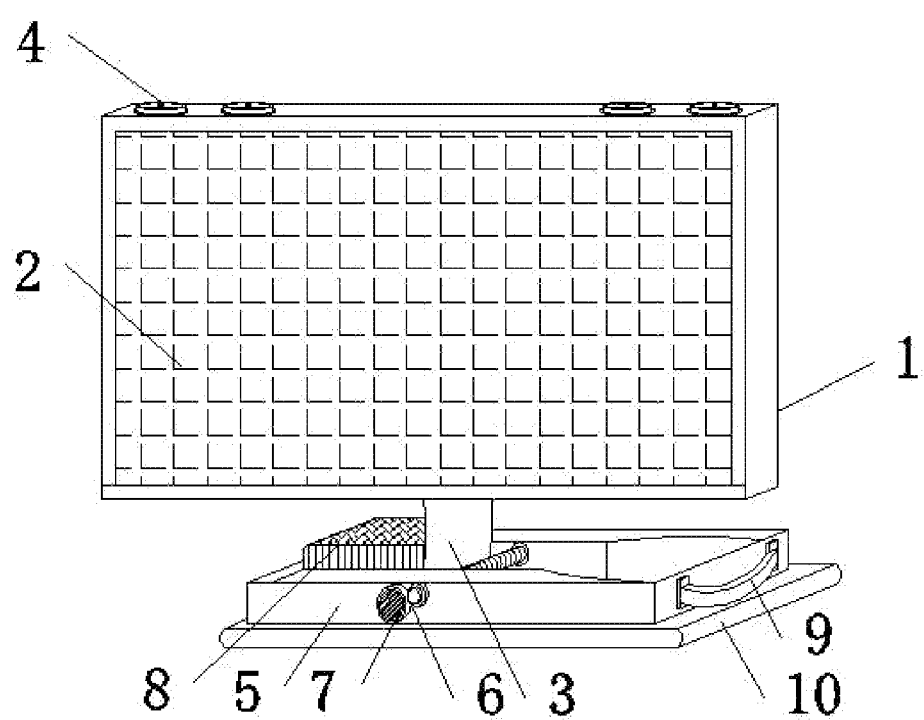
FIG. 1 is a schematic diagram of an entire structure of the present disclosure.

1: all-in-one machine main body; 2: integrated display screen; 3: back box support column; 4: top heat dissipation opening; 5: embedded support seat; 6: support shaft bayonet pin; 7: support column folding shaft; 8: support seat weighting block; 9: embedded storage tab; 10: base antiskid grounding mat; 11: gathering winding column; 12: side embedded storage box; 13: fixed pressing suction cup; 14: hanging hollow guide rail; 15: hanging belt movable piece; 16: adjustable fixed hanging belt; 17: hanging belt stopper; 18: back box connection snap-in slot; 19: connection jack; 20: connection insertion block; 21: embedded back box; 22: back box snap-in spring; 23: spring pull grip; 24: embedded limiting block.

DETAILED DESCRIPTION OF THE EMBODIMENTS

In order to make the objectives, technical solutions and advantages of the present disclosure clearer, the present disclosure is further described below in detail with reference to accompanying drawings and embodiments. It should be understood that the specific embodiments described here are merely to illustrate and explain the present invention, and not intended to limit the present disclosure.

In the description of the present disclosure, it should be noted that orientations or positional relationships indicated by the terms "center", "upper", "lower", "left", "right", "vertical", "horizontal", "inner", "outer", etc. are based on the orientations or positional relationships shown in the drawings, and are only for the convenience of describing the present disclosure and simplifying the description, rather than indicating or implying that the indicated device or element must have a specific orientation or be constructed and operated at a specific orientation. Therefore, these terms cannot be construed as limiting the present disclosure. The terms "first", "second", and "third" are only used for descriptive purposes, and cannot be construed as indicating or implying relative importance. In addition, unless otherwise stated clearly stipulated and defined, the terms "installation", "connection" and "coupling" should be understood in a broad sense. For example, it can be a fixed connection, a detachable connection, an integral connection, a mechanical connection, an electrical connection, direct connection, indirect connection through an intermediate medium, or an internal communication between two elements. Those of ordinary skill in the art can understand the specific meanings of the above terms in the present disclosure according to specific situations.

Referring to FIGS. 1-6, the present disclosure provides one technical solution: a big data cloud computing all-in-one machine apparatus includes an all-in-one machine main body 1, an integrated display screen 2 and a back box support column 3. In some embodiments, a middle part of a top end of the all-in-one machine main body 1 is fixedly connected with the integrated display screen 2, and a front surface of the integrated display screen 2 is fixedly connected with the back box support column 3.

Figure 4:
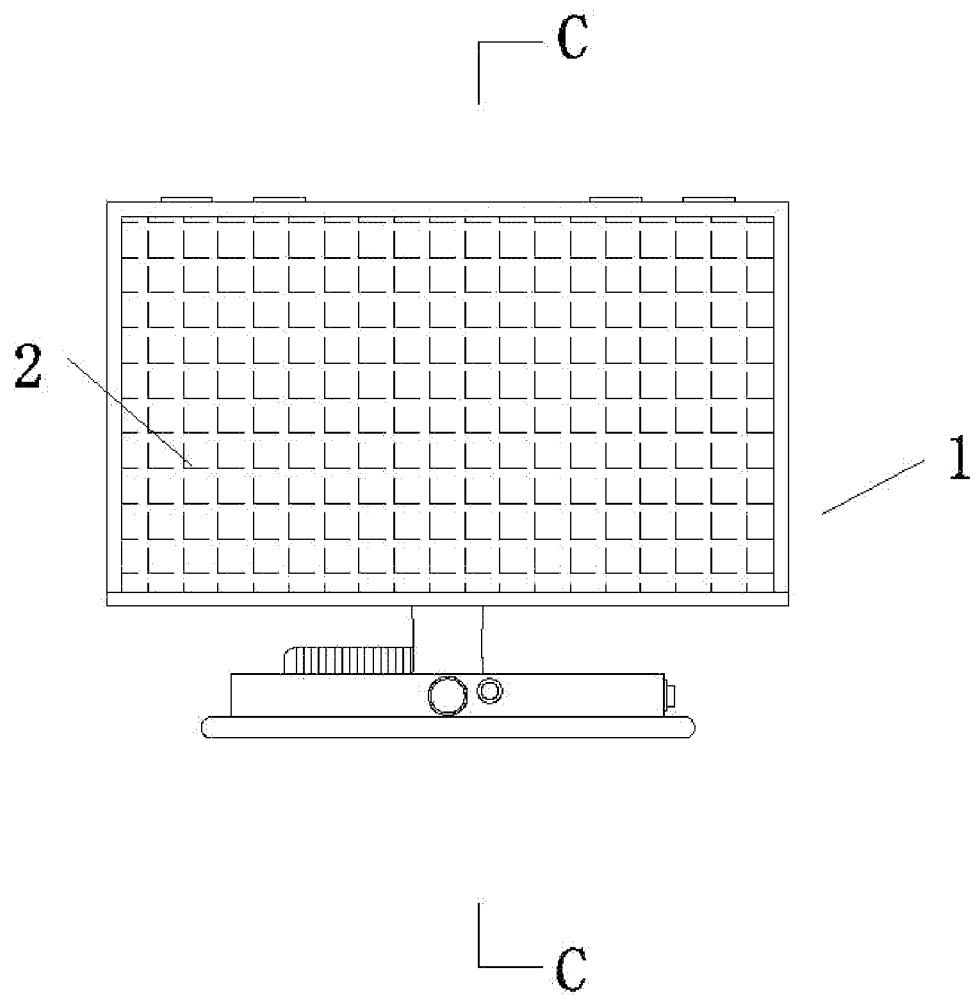
FIG. 4 is a schematic diagram of the front view structure of the all-in-one machine of the present disclosure.

As shown in FIGS. 1 and 4, a bottom of the back box support column 3 is embedded and connected with an embedded support seat 5; an inner middle part of the embedded support seat 5 is connected with a support shaft bayonet pin 6 in a penetrating manner; a bottom middle part of the back box support column 3 is connected with a support column folding shaft 7 in a penetrating manner; and one side of a top end of the embedded support seat 5 is fixedly connected with a support seat weighting block 8.

Figure 2:
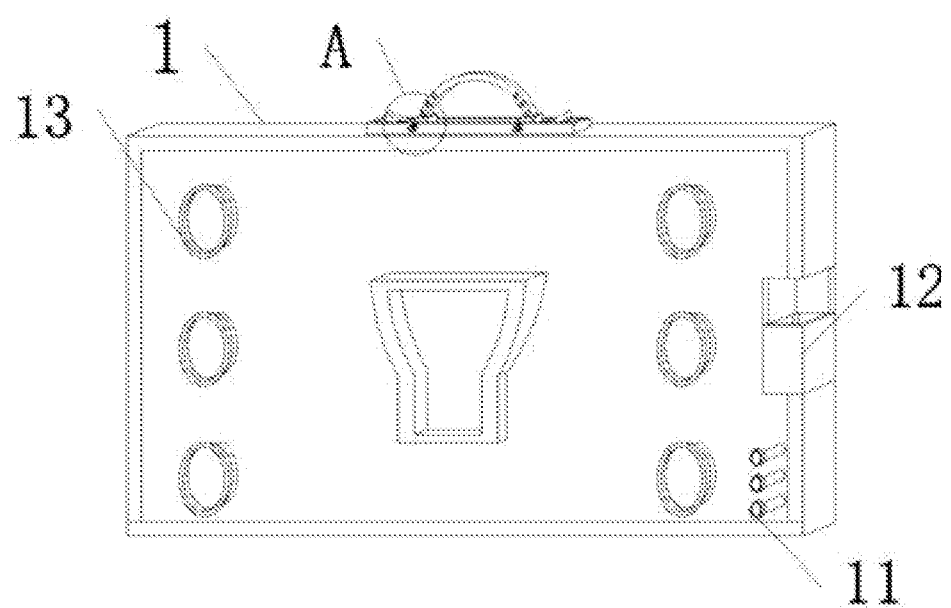
FIG. 2 is a rear view of an all-in-one machine main body of the present disclosure.
Figure 3:
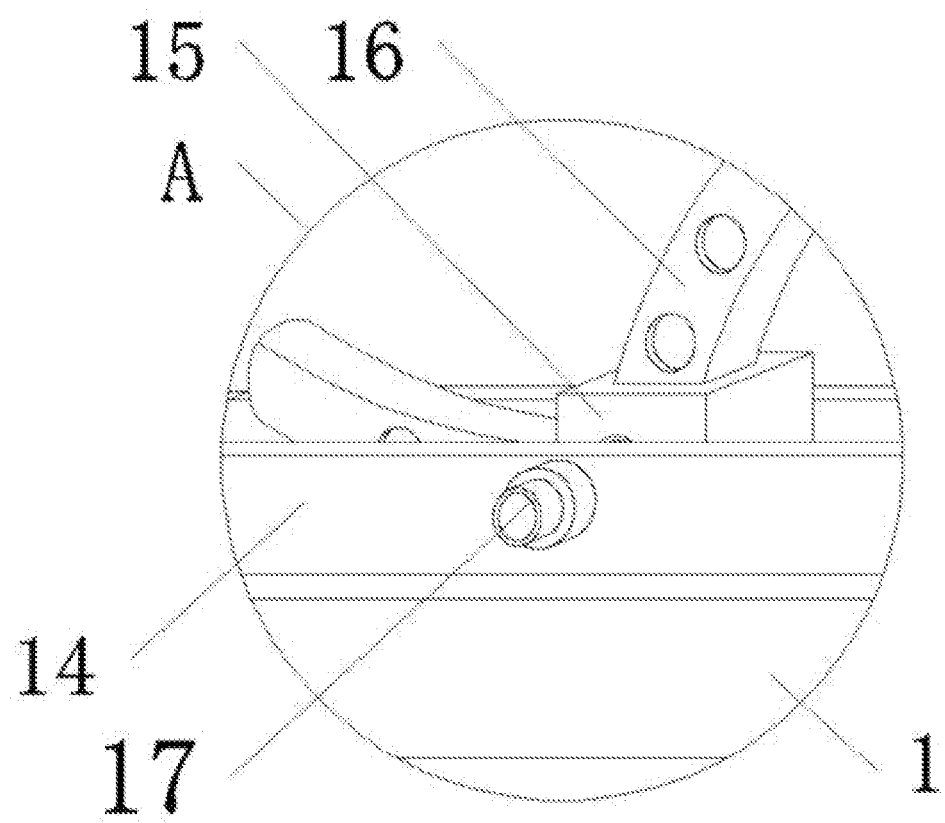
FIG. 3 is an enlarged schematic diagram of a portion A of the present disclosure.

As shown in FIG. 2, two sides of the front surface of the all-in-one machine main body 1 are fixedly connected with fixed pressing suction cups 13. As shown in FIG. 3, the middle part of the top end of the all-in-one machine main body 1 is fixedly connected with hanging hollow guide rail 14, inner sides of the hanging hollow guide rail 14 are movably connected with hanging belt movable pieces 15. An adjustable fixed hanging belt 16 penetrates through and is connected with the hanging belt movable pieces 15, and hanging belt stoppers 17 penetrate through and are connected with the adjustable fixed hanging belt 16.

Figure 5:
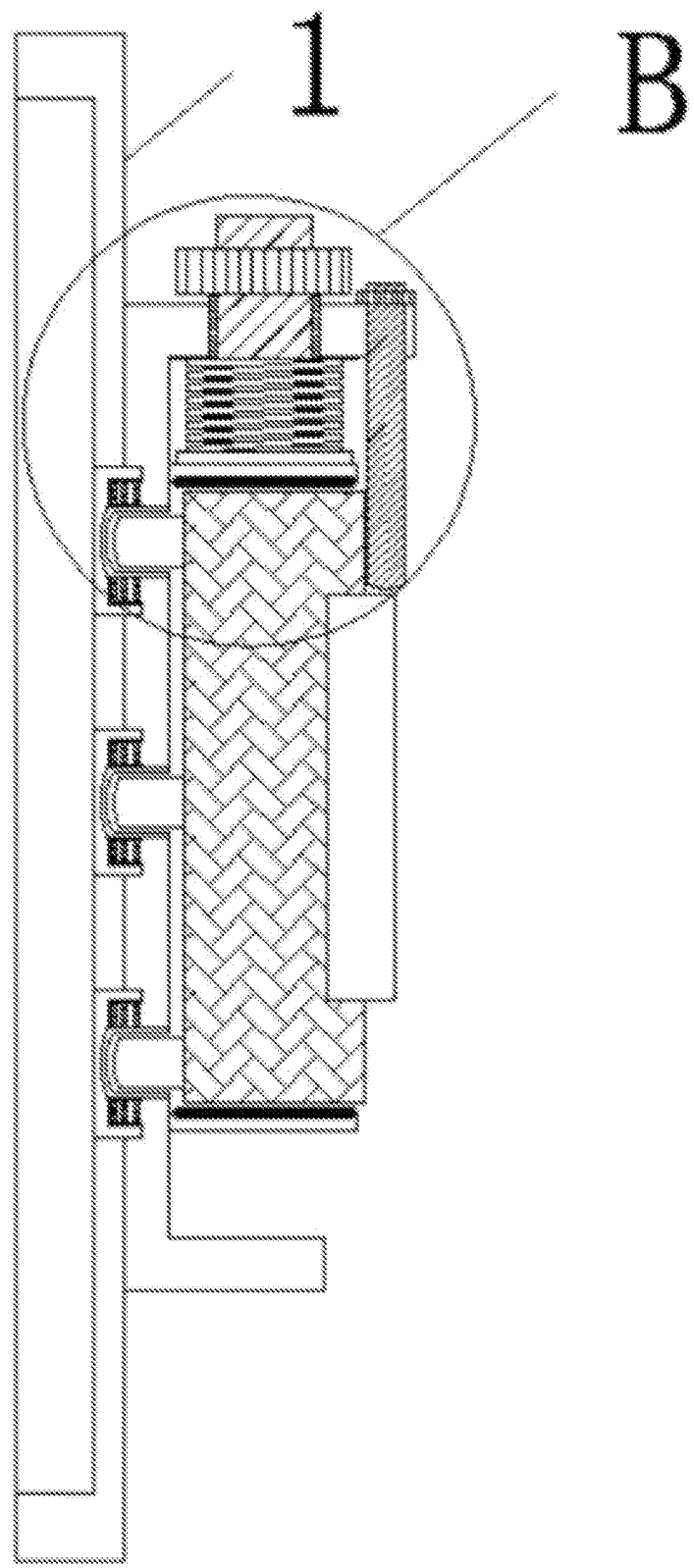
FIG. 5 is a schematic diagram of a sectional structure of an all-in-one machine main body of the present disclosure along the C-C section.
Figure 6:
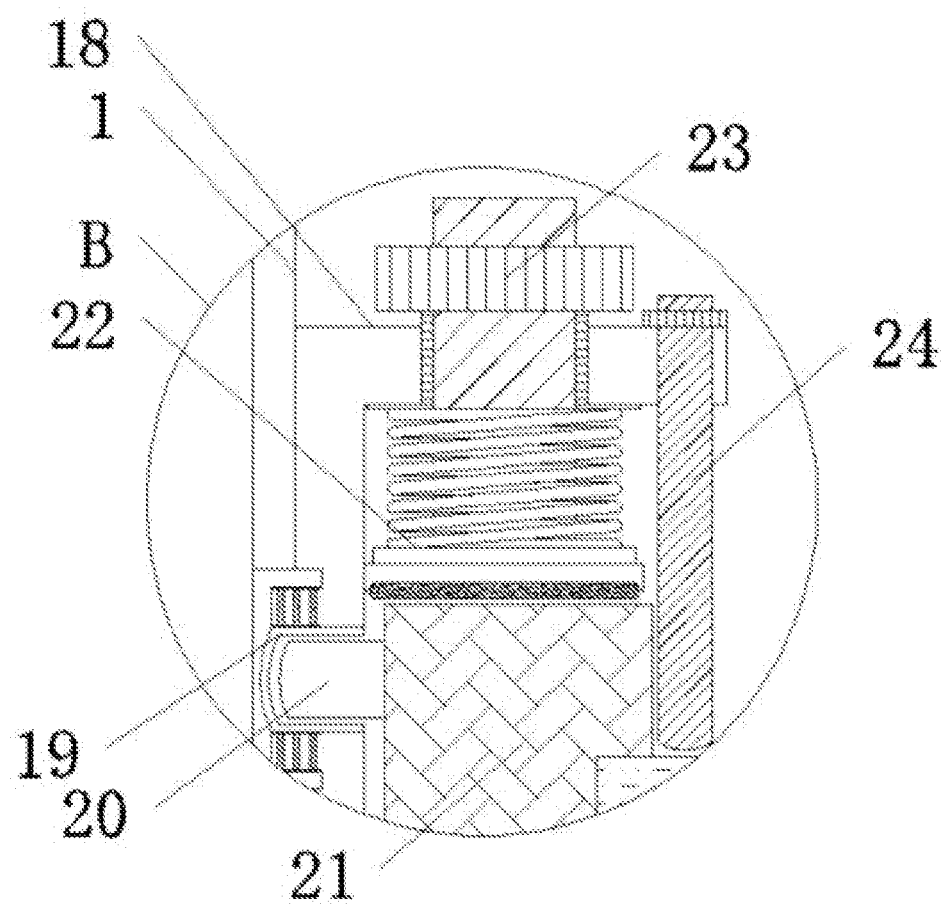
FIG. 6 is an enlarged schematic diagram of a portion B of the present disclosure.

As shown in FIGS. 5 and 6, one end of the all-in-one machine main body 1 is fixedly connected with a back box connection snap-in slot 18, and one inner side of the back box connection snap-in slot 18 is fixedly connected with connection jacks 19. Each connection jack 19 has a connection insertion block 20 inserted therein. One end of the connection insertion block 20 is fixedly connected with an embedded back box 21, and ends of the embedded back box 21 are movably connected with a back box snap-in spring 22. Each back box snap-in spring 22 is sleeved on a spring pull grip 23, and one side of the back box connection snap-in slot 18 is embedded and connected with an embedded limiting block 24.

In some embodiments, both sides of the top end of the all-in-one machine main body 1 are fixedly provided with top heat dissipation openings 4. The existing all-in-one machine does not have an extremely good heat dissipation design. In most existing all-in-one machines, heat dissipation structures are arranged on a back surface or a side surface, so heat dissipation is easily blocked. By providing the top heat dissipation openings 4 at the top end of the all-in-one machine, heat can be dissipated upwards to well prevent the influence on the heat dissipation due to blockage of the side surface or the back surface, which well reflects the heat dissipation effectiveness of the device.

In some embodiments, one end of the embedded support seat 5 is fixedly connected with an embedded storage tab 9. The device has a good gathering portability design, the support base does not have a good force holding structure. By providing the embedded storage tab 9, work staff can hold the embedded storage tab 9 to hold the support base under a force applied. The all-in-one machine is carried and transferred through the embedded storage tab 9, so that the convenience of the device is well improved.

In some embodiments, the bottom end of the embedded support seat 5 is fixedly connected with a base antiskid grounding mat 10. Since the integrated display screen 2 is relatively large, the existing integrated display screen 2 does not have a good stable design. By providing the base antiskid grounding mat 10 which is an antiskid rubber mat arranged at the bottom end of the embedded support seat 5, the friction between the all-in-one machine and a lower mat surface can be well increased to well prevent the all-in-one machine from sliding, which well reflects the reinforcement stability of the all-in-one machine.

In some embodiments, one side of the bottom of the rear surface of the all-in-one machine main body 1 is fixedly connected with a gathering winding column 11. The all-in-one machine is connected with lots of wires, the existing all-in-one machine does not have a good wire gathering structure, and thus placement of the wires at random easily causes intertwining. By providing the gathering winding column 11 which has a good winding column design, the work staff can orderly place the wires along the gathering winding column 11, thus well reflecting the gathering convenience of the all-in-one machine.

In some embodiments, the middle part of one side of the all-in-one machine main body is connected with a side embedded storage box 12 in an embedded manner. During use of the all-in-one machine, related accessory parts such as a remote controller need to be provided. By providing the side embedded storage box 12 which has a good storage box design, the work staff can intensively temporarily put relevant accessory tools into the side embedded storage box 12, thus well reflecting the storage convenience of the all-in-one machine.

In some embodiments, the embedded support seat 5 at the bottom of the back box support column 3, the support shaft bayonet pin 6 at the inner middle part of the embedded support seat 5, the support column folding shaft 7 at the bottom middle part of the embedded support seat 5, and the support seat weighting block 8 on one side of the top end of the embedded support seat 5 jointly form a back box support and storage mechanism. In most existing all-in-one machines, the support column is fixed and cannot be folded, which may cause an inconvenience in transferring and carrying the all-in-one machines. By providing the back box support and storage mechanism, the interior of the embedded support seat 5 is desired as a hollow slot, so that the back box support column 3 can be folded towards the right side around the support column folding shaft 7 of the embedded support seat 5 penetrating through the back box support column 3. The back box support column is embedded into an embedding slot at one side of the embedded support seat 5 when folded to a horizontal state, thus achieving a contracted storage effect. During use, the back box support column 3 is unfolded around the support column folding shaft 7 to a vertical state; the support shaft bayonet pin 6 is inserted from one side to support a display screen to work. Moreover, the support seat weighting block 8 arranged on the left side can well balance a relatively short force arm of the support seat located at the left side, which well reflects the storage flexibility of the all-in-one machine.

In some embodiments, the fixed pressing suction cups 13 on both sides of the front surface of the all-in-one machine main body 1, the hanging hollow guide rail 14 at the middle part of the top end of the all-in-one machine main body 1, the hanging belt movable pieces 15 between the inner sides of the hanging hollow guide rail 14, the adjustable fixed hanging belt 16 penetrating through the hanging belt movable piece 15, and the hanging belt stoppers 17 penetrating through the adjustable fixed hanging belt 16 jointly form an integrated installation fixing mechanism. The existing all-in-machines are not provided with a good installation fixing design, and are supported only by supports, thereby limiting the installation. By providing the integrated installation fixing mechanism, the integrated installation fixing mechanism can be hung on a hook or a rod through the adjustable fixed hanging belt 16. During installation, the adjustable fixed hanging belt 16 is hanged onto the hook, and is pulled to move the hanging belt movable pieces 15 along the hanging hollow guide rail 14 so that the adjustable fixed hanging belt 16 tightly wrap the hook. After wrapping, the hanging belt stoppers 17 are threaded into limiting holes of the hanging belt located at corresponding positions to complete installation. Further, the fixed pressing suction cups 13 are tightly sucked on a smooth wall surface by using an air pressure difference, thus well reflecting the installation fixity of the all-in-one machine.

In some embodiments, the back box connection snap-in slot 18 at one end of the all-in-one machine main body 1, the connection jacks 19 on one inner side of the back box connection snap-in slot 18, the connection insertion blocks 20 being inserted into the connection jack 19, the embedded back box 21 at ends of the connection insertion blocks 20, the back box snap-in spring 22 at the top end of the embedded back box 21, and the spring pull grip 23 sleeved in the back box snap-in spring 22 jointly from an all-in-one machine back box assembling fixing mechanism. In most existing all-in-one machines, the connection back box is fixed, which is inconvenient to assemble and disassemble, and the assembling fixity is low. By providing the all-in-one machine back box assembling fixing mechanism, during assembling, the embedded back box 21 is embedded into the back box connection snap-in slot 18. In the embedding process, the connection insertion block 20 is snapped into the connection jack 19 to complete connection. After the embedding, the embedded back box 21 is snapped into place and fixed through the back box snap-in spring 22. Then, the spring is fixed through the spring pull grip 23, and finally, the embedded limiting block 24 is threaded into the back box connection snap-in slot 18 to limit the embedded back box 21, thus further improving the assembling fixity. During disassembling, only the spring is released according to the above steps, and the embedded back box 21 is taken out, which well reflects the assembling convenience of the all-in-one machine.

The working principle of the all-in-one machine is described below. Firstly, by providing the base antiskid grounding mat 10 which is an antiskid rubber mat arranged at the bottom end of the embedded support seat 5, the friction between the all-in-one machine and a lower mat surface can be well increased, which well prevents the all-in-one machine from sliding and well reflects the reinforcement stability of the all-in-one machine.

By the providing of the side embedded storage box 12 which has a good storage box design, the work staff can intensively temporarily put relevant accessory tools into the side embedded storage box 12, thus well reflecting the storage convenience of the all-in-one machine.

Then, by providing the back box support and storage mechanism, the interior of the embedded support seat 5 is of the hollow slot design, so that the back box support column 3 can be folded to the right around the support column folding shaft 7 of the embedded support seat 5 that penetrates through the back box support column 3. The back box support column is embedded into an embedding slot on one side of the embedded support seat 5 when folded to a horizontal state, thus achieving a contracted storage effect. During use, the back box support column 3 is unfolded to a vertical state around the support column folding shaft 7; the support shaft bayonet pin 6 is inserted from one side to support a display screen to work. Further, the support seat weighting block 8 arranged on the left side can well balance a relatively short force arm of the support seat located on the left side, which well reflects the storage flexibility of the all-in-one machine.

Next, by providing the integrated installation fixing mechanism, the integrated installation fixing mechanism can be hung onto a hook or a rod through the adjustable fixed hanging belt 16. During installation, the adjustable fixed hanging belt 16 is hanged onto the hook, and is pulled to move the hanging belt movable pieces 15 along the hanging hollow guide rail 14 so that the adjustable fixed hanging belt 16 tightly wraps the hook. After wrapping, the hanging belt stoppers 17 are threaded into limiting holes at corresponding positions of the hanging belt to complete installation, and, the fixed pressing suction cups 13 are tightly sucked on a smooth wall surface by using an air pressure difference, thus well reflecting the installation fixity of the all-in-one machine.

Finally, by providing the all-in-one machine back box assembling fixing mechanism, during assembling, the embedded back box 21 is embedded into the back box connection snap-in slot 18. In the embedding process, the connection insertion block 20 is snapped into the connection jack 19 to complete connection. After the embedding, the embedded back box 21 is snapped into place and fixed through the back box snap-in spring 22. Then, the spring is fixed through the spring pull grip 23, and finally, the embedded limiting block 24 is threaded into the back box connection snap-in slot 18 to limit the embedded back box 21, thus further improving the assembling fixity. During disassembling, only the spring is released according to the above steps, and the embedded back box 21 is taken out, which well reflects the assembling convenience of the all-in-one machine. This is the working principle of the big data cloud computing all-in-one machine apparatus.

The above descriptions are only the preferred embodiments of the present disclosure, and is not intended to limit the present disclosure. Any modifications, equivalent replacements and improvements that are made within the spirit and principle of the present disclosure shall fall within the protection scope of the present disclosure.

What is claimed:

1. A big data cloud computing all-in-one machine apparatus, comprising an all-in-one machine main body, an integrated display screen and a back box support column, wherein a middle part of a top end of the all-in-one machine main body is fixedly connected with the integrated display screen, and a front surface of the integrated display screen is fixedly connected with the back box support column;

a bottom of the back box support column is embedded and connected with an embedded support seat; an inner middle part of the embedded support seat is connected with a support shaft bayonet pin in a penetrating manner; a bottom middle part of the back box support column penetrates through a support column folding shaft; one side of a top end of the embedded support seat is fixedly connected with a support seat weighting block;

two sides of the front surface of the all-in-one machine main body are fixedly connected with fixed pressing suction cups; the middle part of the top end of the all-in-one machine main body is fixedly connected with a hanging hollow guide rail; inner sides of the hanging hollow guide rail are movably connected with hanging belt movable pieces; an adjustable fixed hanging belt penetrates through and is connected with each hanging belt movable piece, and hanging belt stoppers penetrate through and are connected with the adjustable fixed hanging belt;

one end of the all-in-one machine main body is fixedly connected with a back box connection snap-in slot; one inner side of the back box connection snap-in slot is fixedly connected with connection jacks; each connection jack has a connection insertion block inserted therein; one end of the connection insertion block is fixedly connected with an embedded back box; a top end of the embedded back box is movably connected with a back box snap-in spring; each back box snap-in spring is sleeved on a spring pull grip; and one side of the back box connection snap-in slot is connected with an embedded limiting block in an embedded manner.

2. The big data cloud computing all-in-one machine apparatus according to claim 1, wherein two sides of the top end of the all-in-one machine main body are fixedly connected with top heat dissipation openings.

3. The big data cloud computing all-in-one machine apparatus according to claim 1, wherein one end of the embedded support seat is fixedly connected with an embedded storage tab.

4. The big data cloud computing all-in-one machine apparatus according to claim 1, wherein a bottom end of the embedded support seat is fixedly connected with a base antiskid grounding mat.

5. The big data cloud computing all-in-one machine apparatus according to claim 1, wherein one side of a bottom of a rear surface of the all-in-one machine main body is fixedly connected with gathering winding columns.

6. The big data cloud computing all-in-one machine apparatus according to claim 1, wherein a middle part of one side of the all-in-one machine main body is connected with a side-embedded storage box in an embedded manner.

7. The big data cloud computing all-in-one machine apparatus according to claim 1, wherein the embedded support seat at the bottom of the back box support column, the support shaft bayonet pin at the inner middle part of the embedded support seat, the support column folding shaft at the bottom middle part of the embedded support seat, and the support seat weighting block on one side of the top end of the embedded support seat jointly form a back box support and storage mechanism.

8. The big data cloud computing all-in-one machine apparatus according to claim 1, wherein the fixed pressing suction cups on both sides of the front surface of the all-in-one machine main body, the hanging hollow guide rail at the middle part of the top end of the all-in-one machine main body, the hanging belt movable piece on the inner side of the hanging hollow guide rail, the adjustable fixed hanging belt on the inner side of the hanging belt movable piece, and the hanging belt stoppers on the inner side of the adjustable fixed hanging belt jointly form an integrated installation fixing mechanism.

9. The big data cloud computing all-in-one machine apparatus according to claim 1, wherein the back box connection snap-in slot at the one end of the all-in-one machine main body, the connection jack on the one inner side of the back box connection snap-in slot, the connection insertion block on the inner side of the connection jack, the embedded back box at the one end of the connection insertion block, the back box snap-in spring at the top end of the embedded back box, and the spring pull grip on the inner side of the back box snap-in spring jointly from an all-in-one machine back box assembling fixing mechanism.

\* \* \* \* \*